United States Patent [19]

Hirsch

[11] Patent Number: 4,810,922

[45] Date of Patent: Mar. 7, 1989

[54] DAMPING DECOUPLED OSCILLATOR USING A HIGH IMPEDANCE CRYSTAL

[75] Inventor: Kelly L. Hirsch, Redmond, Wash.

[73] Assignee: Sundstrand Data Control, Inc., Redmond, Wash.

[21] Appl. No.: 145,813

[22] Filed: Jan. 19, 1988

[51] Int. Cl.[4] ............................................. H01L 41/08
[52] U.S. Cl. ..................................... 310/316; 318/116; 331/116 R
[58] Field of Search ....................... 310/316, 317, 319; 318/116, 118; 331/1 R, 12, 29, 35, 65, 73, 107 A, 116 R, 154, 158

[56] References Cited

U.S. PATENT DOCUMENTS

| | | | |
|---|---|---|---|
| 3,967,143 | 6/1976 | Watanabe et al. | 310/316 |
| 4,197,478 | 4/1980 | Silvus | 310/316 |
| 4,275,363 | 6/1981 | Mishiro et al. | 310/316 X |
| 4,587,958 | 5/1986 | Noguchi et al. | 310/316 X |
| 4,687,962 | 8/1987 | Elbert | 310/316 |

Primary Examiner—Mark O. Budd
Attorney, Agent, or Firm—Christensen, O'Connor, Johnson & Kindness

[57] ABSTRACT

A crystal controlled oscillator in which changes in damping are compensated and a method for decoupling the output signal of such an oscillator from damping changes. The damping decoupled oscillator includes a quartz crystal (10), which produces a periodic signal, connected in series with a variable gain amplifier (18) and a variable phase shift circuit (22). Feedback from the output of the variable phase shift circuit is provided to sustain oscillation of the crystal. Unity gain in the loop is maintained by adjusting the gain of the variable gain amplifier in accordance with the DC value of the output signal, provided by a precision rectifier (34). As the DC value of the output signal changes due to changes in damping or energy loss of the crystal, an absolute value circuit (38) responds by providing a phase control signal for adjusting the phase of the periodic signal to compensate for changes in damping. The output signal of the oscillator is thus controlled at a constant amplitude, with substantially reduced frequency shift.

18 Claims, 5 Drawing Sheets

DAMPING DECOUPLED OSCILLATOR USING A HIGH IMPEDANCE CRYSTAL

TECHNICAL FIELD

This invention generally pertains to crystal oscillators, and specifically, to improving the stability of an oscillator using a crystal optimized for force sensing and having a relatively high impedance.

BACKGROUND OF THE INVENTION

Crystal controlled oscillators are frequently used as a time or frequency reference due to their long term stability. In most such applications, a quartz crystal is connected in series with an amplifier, providing energy to sustain oscillation of the crystal at its resonance frequency. The output of the amplifier is also connected to a system requiring the stability of the reference frequency output from the oscillator.

An equivalent circuit for a quartz crystal includes an inductor, L, a resistance, R, and a capacitance, C, all connected in series; in addition, the preceding series connected elements are connected in parallel with a capacitor, $C_0$. The stability of the resonant frequency and operating phase of the crystal directly depend on the relative stability of these four equivalent circuit elements. In a tuned quartz crystal oscillator, the four equivalent circuit elements tend to be very stable, and their stability may be further enhanced by mounting the crystal in an evacuated housing, and placing it in a temperature controlled environment. However, a quartz crystal may be used in applications in which it cannot be environmentally controlled, and in which the relative stability of the equivalent circuit elements is more likely to vary than is the case with more conventional tuned crystal oscillators. Such is the case when a crystal having a high mechanical Q is used for sensing force.

U.S. Pat. No. 4,215,570 discloses an improved design for a force sensing crystal having a relatively high Q of approximately 100,000 (a high Q insures that less external energy must be supplied to sustain the crystal oscillations and that the crystal will have a more stable resonant frequency). The crystal in this force sensor is shaped like a double-ended tuning fork, i.e., it is divided into two end portions connected by two wide bars separated by a narrow slot. Each bar is excited into vibration by electrical contacts or pads carried thereon, in conjuction with an appropriate oscillating circuit. The frequency of the vibration is a function of the magnitude of the force transmitted from the end portions to the bars. In relating the force sensing crystal to the equivalent circuit elements described above, the value of L corresponds to the mass of the tuning fork tines, i.e. The mass of the wide bars, and the density of the surrounding gas. The value of C is determined by the stiffness of the tines, while R relates to the damping of the vibrational motion. The real capacitance between the electrodes carried on the tines is represented by $C_0$.

In a typical tuned crystal oscillator, the phase response of the crystal is directly related to the frequency of oscillation, such that the loop gain is exactly one at a phase angle of zero degrees. Since a crystal oscillator includes both a piezoelectric crystal and its associated electronic circuit, any deviation from zero phase angle in the crystal must be offset by the circuit. thus, if the crystal operates at a complex admittance, Y, at a phase angle, $\theta$, the electronics must operate with a transimpedance of $1/Y$, at a phase angle, $-\theta$.

When a piezoelectric crystal is cut as described in the above-referenced referenced patent and geometrically optimimized to sense force, its dynamic equivalent series resistance, R, becomes substantially greater than that of a crystal used in a conventional tuned oscillator. The value of R corresponds to the damping of the crystal's vibration or the amount of energy lost by the crystal per cycle of vibration. In a force sensing crystal, R can vary due to changes in: (a) the energy lost to the lattice structure of the crystal; (b) energy lost to the gas surrounding the crystal; and (c) energy lost to the pads on which the crystal is mounted, i.e. energy dissipated in the force sensor assembly.

The phase response of a force sensing crystal admittance at a frequency, $\omega$, may be expressed in terms of the crystal equivalent circuit parameters, as follows:

$$\theta_y(\omega) = \text{Tan}^{-1}\frac{(C_0 + C) - C_0 C L \omega^2}{-RC_0 C \omega} - \text{Tan}^{-1}\frac{RC\omega}{1 - LC\omega^2} \quad (1)$$

From equation 1, it will be apparent that $\theta_y(\omega)$ is dependent upon all the equivalent circuit parameters and $\omega$. The parameters $C_0$ and L are generally relatively stable in a force sensing crystal; however, as already explained, the damping or energy loss, R, is subject to variation, and the value, C, changes as a function of the applied force. Further, a shift in the phase response due to a change in R will cause the oscillation frequency of the crystal to change. Any change in the crystal frequency that is not caused by a variation in the force which the crystal is sensing will cause an error in the output signal produced by the force sensing transducer comprising the crystal. This problem is particularly manifest in force sensing crystals having a high Q and operated in a gas environment rather than a vacuum.

Accordingly, it is an object of the present invention to decouple changes in damping or energy loss in a force sensing crystal from the phase response and frequency of the crystal. A further object is to provide a circuit which compensates for changes in admittance and phase response of the crystal. These and other objects and advantages of the invention will be apparent from the attached drawings and the description of the preferred embodiment that follows.

SUMMARY OF THE INVENTION

In accordance with the present invention, a damping decoupled crystal oscillator includes a piezoelectric crystal driven to oscillate close to its resonant frequency, producing a periodic signal. A feedback signal derived from the periodic signal is connected to the crystal in a feedback loop to sustain its oscillation. Connected to the crystal is a variable gain amplifier, which serves to amplify the periodic signal at a gain that depends upon a gain control signal. Variable phase shift means are connected in series relationship with the variable gain amplifier, and are operative to introduce a phase shift in the signal produced by the piezoelectric crystal in response to a phase control signal. The feedback signal is derived from an output signal produced by the variable gain amplifier and the phase shift means.

A rectifier rectifies the output signal, producing the gain control signal. Damping change compensation means are connected to receive the gain control signal, and as a function thereof, are operative to produce the phase control signal. By thus varying the gain and controlling the phase of the crystal oscillator output signal, its frequency is compensated and decoupled from changes in damping to which the piezoelectric crystal may be subjected.

BRIEF DESCRIPTION OF THE DRAWING FIGURES

DISCLOSURE OF THE PREFERRED EMBODIMENT

The piezoelectric crystal used in a typical force sensing transducer has a relatively low mechanical Q (i.e., 2000), and is mounted in an enclosure filled with a gas. Thus, it is more likely to be subject to changes in damping or energy loss represented by the equivalent circuit element R, for the reasons described above, than is a crystal used in a conventional tuned oscillator. Changes in the value of R directly affect the accuracy of a force transducer, since they cause its output frequency to vary in a manner not related to the changes in force acting on the force transducer. The present damping decoupled oscillator provides means for compensating changes in damping to minimize the error in the output signal from that source.

For a piezoelectric crystal, there exist two frequencies at which differential changes in damping represented by R have little effect on the phase response of an oscillator circuit. One of the frequencies is associated (but not equal to) the resonance frequency of the crystal, and the other frequency is associated with its anti-resonance frequency. (The resonance frequency of a crystal is the frequency at which the phase response is zero and the admittance function peaks; conversely, anti-resonance is the frequency at which the phase is zero and the admittance is minimum.) Since the crystal used in a force sensor is operated near its resonant frequency, only the damping decoupling frequency close to resonance, $\omega_{DD}$, is of interest in the following discussion.

The value of the damping decoupling frequency $\omega_{DD}$ may be computed by setting the partial derivative of the phase response with respect to R equal to zero as shown in the following equation:

$$\frac{\partial \theta_y(\omega)}{\partial R} = 0 \tag{2}$$

Substituting the value for $\theta_y(\omega)$ from equation 1 in equation 2, and taking the derivative:

$$L^2C^2\omega^4 - \left(R^2C^2 + 2CL + \frac{LC^2}{C_0}\right)\omega^2 + \left(1 + \frac{C}{C_0}\right) = 0 \tag{3}$$

Applying the formula for the general solution of a quadratic equation, the following result is obtained:

$$\omega_{DD} = \left[\frac{-B \pm \sqrt{B^2 - 4AD}}{2A}\right]^{\frac{1}{2}} \tag{4}$$

where: $A = L^2C^2$ (5)

$$B = -\left(R^2C^2 + 2CL + \frac{LC^2}{C_0}\right) \tag{6}$$

$$D = 1 + \frac{C}{C_0} \tag{7}$$

Figure 1:
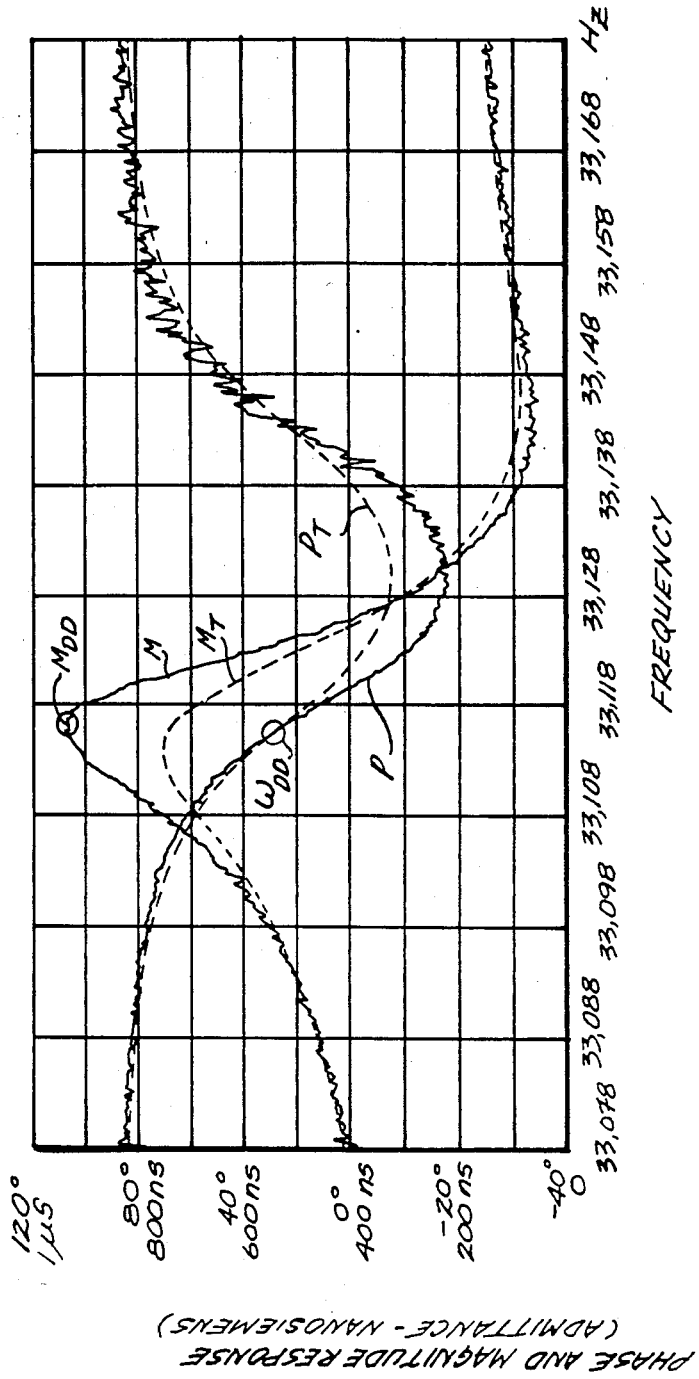
FIG. 1 is a graph showing both the theoretical and measured phase response (admittance) and magnitude response of an output signal produced by a force sensing crystal as a function of its frequency of vibration.

The accuracy of the solution for $\omega_{DD}$ defined by equation 4 can be partially verified as shown in FIG. 1. In this Figure, an impedance analyzer was used to measure the phase and magnitude response of a force sensing crystal having defined values for L, C, R, and $C_0$ over a range of frequencies extending from 33.078 kHz through 33.168 kHz. The resulting phase response and magnitude response curves are plotted and labeled P and M respectively. Thereafter, using the impedance analyzer's built-in simulation function, the response in terms of phase angle and magnitude were again plotted using a substantially greater value for R. The value of R changed from an actual impedance of 1.138 megohms in generating curves M and P to a simulated impedance of 1.500 megohms in generating the curves $M_t$ and $P_t$. It will be apparent from studying FIG. 1 that the curve for P and $P_t$ cross over at a frequency equal to 33.115750 kHz. The value obtained for frequency using Equation 4 is 33.115137 kHz. FIG. 1 thus verifies that the solution for the damping decoupled frequency, $\omega_{DD}$, is valid, since a relatively large change in R (+31%) does not affect the phase response at $\omega_{DD}$. In other words, relatively small changes in R when the crystal is operating close to the $\omega_{DD}$ frequency would not cause a shift in frequency. Unfortunately, in a force sensing crystal, the frequency of the crystal's vibration varies with the force applied, causing the operating point to vary from the optimum $\omega_{DD}$. In addition, larger changes in R do produce a noticeable error in the crystal frequency since $\omega_{DD}$ is derived for differentially small changes in R. Furthermore, since the magnitude function peaks at or near the damping decoupling frequency, phase noise is reduced in an oscillator operating at that frequency. This reduction in phase noise occurs because the corresponding transfer function for phase noise has a minimum amplitude when the nominal frequency is at the peak of the magnitude response.

As shown by equation 4, $\omega_{DD}$ depends upon all of the equivalent circuit parameters, including stray capacitance, $C_0$. In a force sensing transducer having closely controlled hermeticity, the value for L is likely to remain constant. In addition, the value for $C_0$ is essentially constant once the sensor is assembled, because it is related to the capacitance of a "glass capacitor." However, both C and R can change considerably during the measurement of force. The value for C is related to the force being measured and can vary the vibrational frequency of the oscillator by as much as ±10%, i.e., up to ±3 kHz. R may change from 500 K ohms to more than 1.5 megohms when the force sensing crystal is sealed inside an hermetic enclosure and its temperature is varied from −55° C. to 125° C. Such changes in the value of R represent an unacceptable error in the output signal produced by a force sensing crystal.

Figure 2:
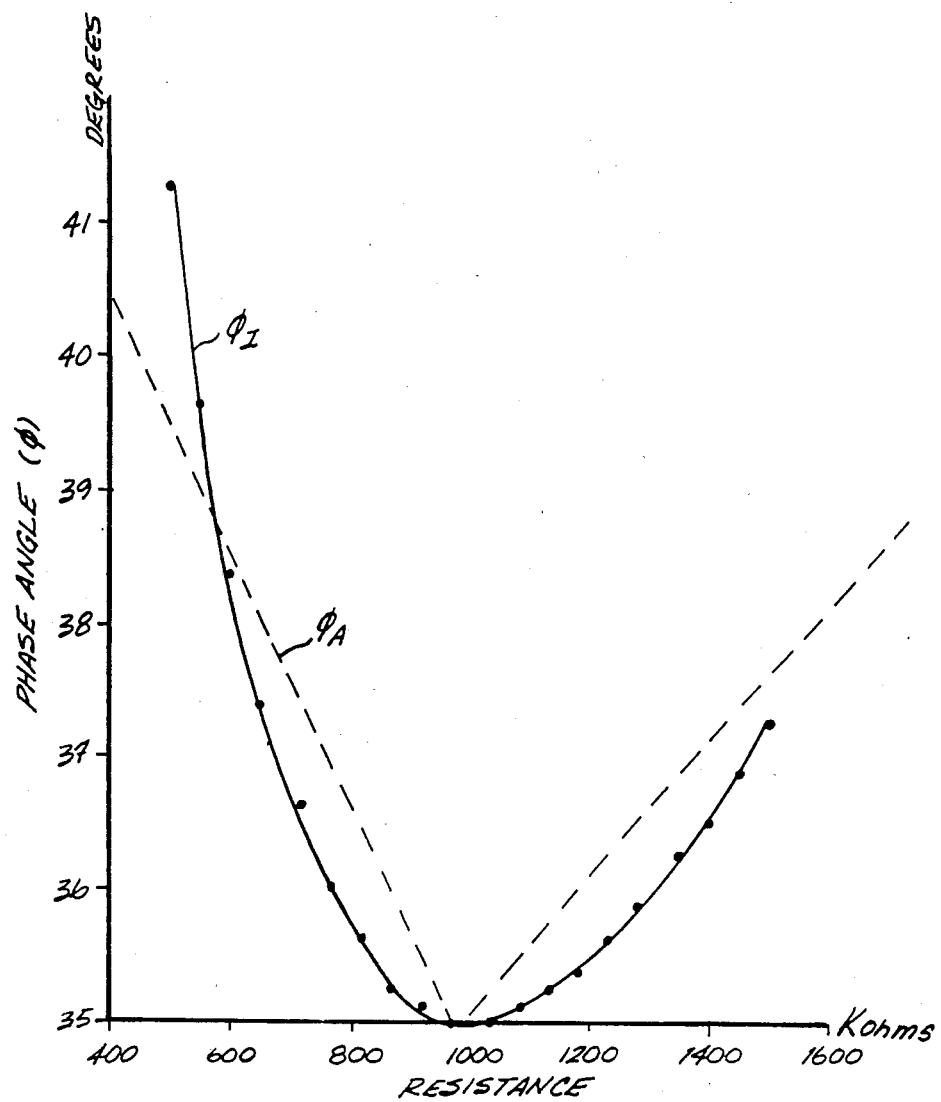
FIG. 2 is a graph illustrating the shape of the phase response curve of the electronic damping decoupling means that is used to compensate and decouple a force sensing crystal for changes in damping, and the shape of the absolute value function used to approximate that curve.
Figure 3:
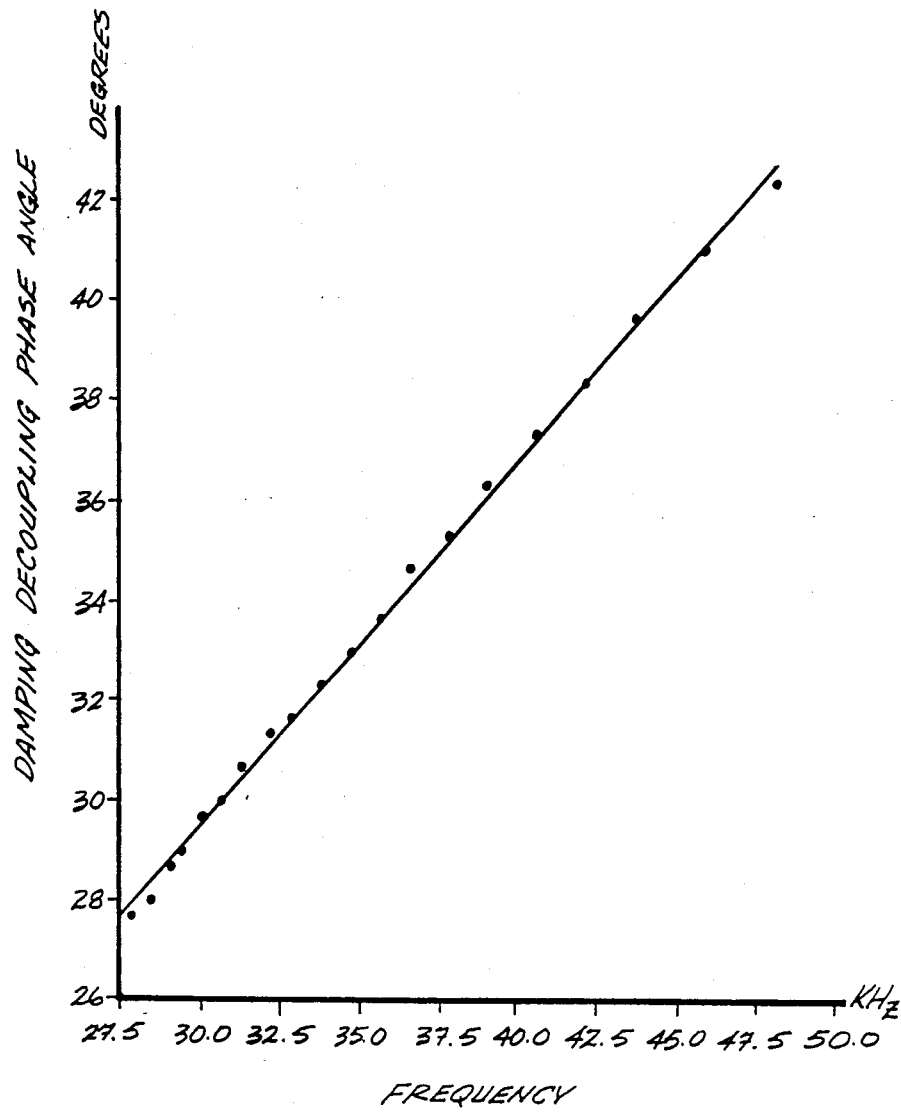
FIG. 3 is a graph illustrating the relationship of the damping decoupling phase angle relative to the frequency of the crystal's oscillation.

In the present invention, the crystal oscillator is calibrated to operate at the nominal frequency $\omega_{DD}$, with zero applied force, and at a temperature of 25° C. Subsequent changes in the equivalent circuit parameter R are then decoupled by applying a compensating phase response in the electronics associated with the crystal. The parabola shaped curve illustrated in FIG. 2 shows the compensation for phase angle as a function of the resistance R which ideally should be provided to compensate for the variable damping of the crystal. This curve, designated $\phi_I$, was plotted based on data resulting from a calculation in which the frequency $\omega$ in equation 4 was held constant as R was varied. To simplify the compensation provided in the electronics associated with the crystal, an approximation to curve $\phi_I$ is made, using an absolute value function, producing the "V" shaped curve $\phi_A$ shown in FIG. 2. The electronics associated with the crystal must also provide a linear phase response compensation as a function of the crystal's operating frequency, as shown in FIG. 3. This compensation is required to track changes in operating frequency that occur as the applied force changes.

Figure 4:
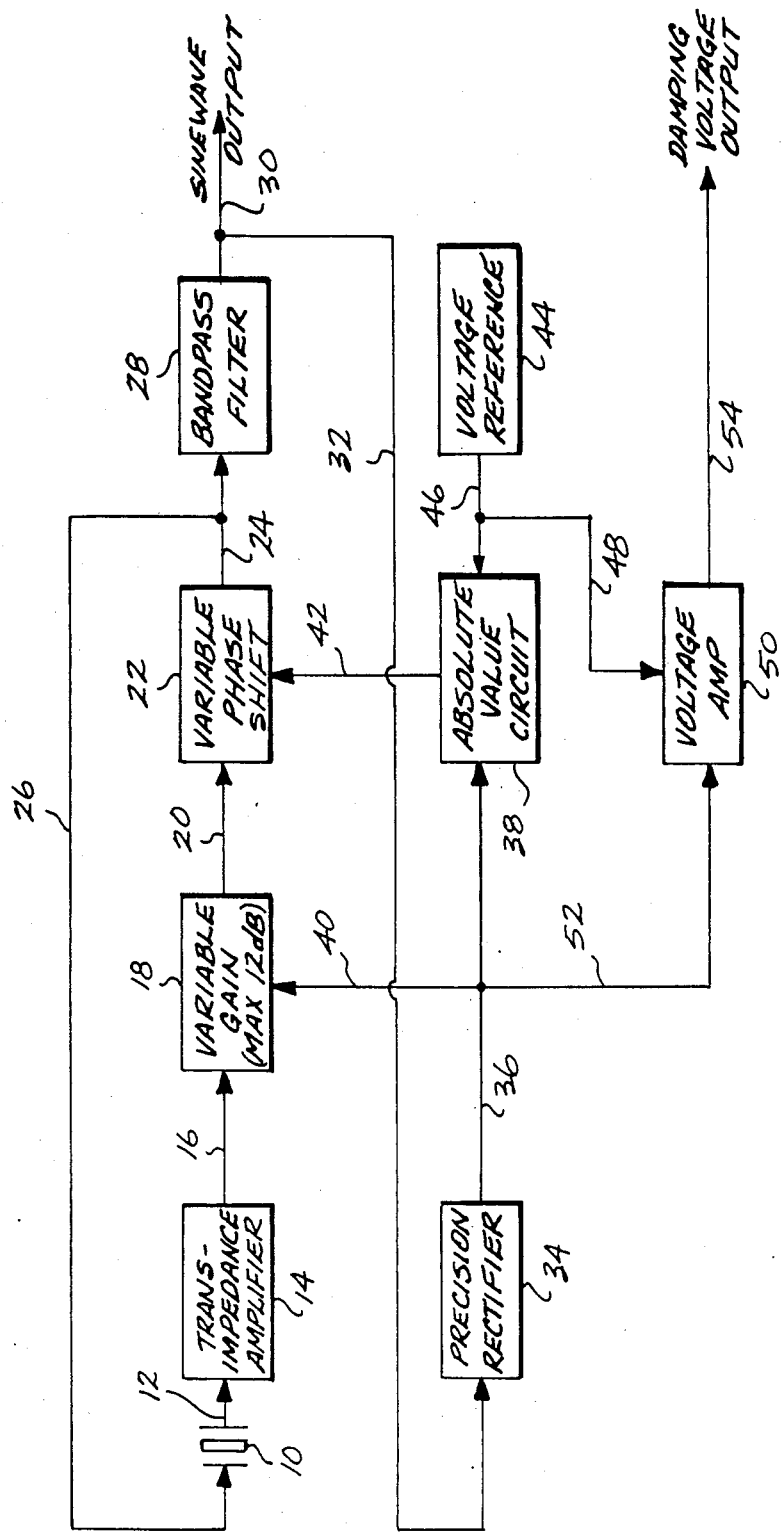
FIG. 4 is a block diagram of the damping decoupled oscillator.

A block diagram of crystal oscillator in which such damping decoupling compensation is provided is shown in FIG. 4. With reference thereto, a piezoelectric quartz crystal 10 is included for sensing force. The crystal is configured as disclosed in the above-referenced U.S. Pat. No. 4,215,570, the disclosure of which is hereby incorporated by reference. Crystal 10 is connected via conductor 12 to a transimpedance amplifier 14, which serves the function of a current-to-voltage amplifier. As quartz crystal 10 vibrates at a frequency close to its resonance frequency, a corresponding periodic signal is produced at the output of transimpedance amplifier 14. The output of amplifier 14 is connected by conductor 16 to a variable gain amplifier 18. The gain of the amplifier is determined by a gain control signal that is input over a conductor 40. Derivation of the gain control signal is described below.

The amplified periodic signal from variable gain amplifier 18 is conveyed over conductor 20 to a variable phase shift circuit 22 which implements a compensating shift in the phase of the periodic signal in response to a controlling phase shift signal that is input over conductor 42, and which is derived to approximate the phase compensation curve, $\phi_I$, shown in FIG. 2. Variable phase shift circuit 22 is able to change the phase of the periodic signal over the range from −30° to −15°. By changing the phase of the periodic signal as a function of the change in the equivalent circuit resistance, R, according to the compensation curve, the output from variable phase shift circuit 22 on conductor 24 is decoupled from such changes in resistance. Conductor 24 provides an input to a band pass filter 28, and is connected to a feedback conductor 26 over which the phase compensated signal is fed back to crystal 10 to sustain its oscillation.

Band pass filter 28 has a Q of approximately 2.3 in the preferred embodiment, and a center frequency $F_0$ equal to 35 kHz. The purpose of the band pass filter is to reject interference, i.e., 60 Hz noise, which might otherwise cause phase jitter. In addition, band pass filter 28 includes an amplifier, producing a sine wave output signal on conductor 30 of about 3 volts peak-to-peak. The output signal is also conveyed via conductor 32 to a precision rectifier 34. In response to the sine wave output signal, precision rectifier 34 produces a DC level which is input via conductor 36 to an absolute value circuit 38. In addition, the DC level serves as the gain control signal input to variable gain amplifier 18 over conductor 40. It will thus be apparent that precision rectifier 34 is disposed in a feedback loop that maintains a fixed or constant output signal level.

The feedback provided by conductor 32, after it is rectified, also serves as an indication of the amount of phase shift required to compensate for variations in the value, R, within crystal 10. The rectified DC signal that is input to the absolute value circuit 38 is compared to a stable reference voltage from voltage reference 44 and input to the absolute value circuit over conductor 46. This reference voltage establishes the nominal 35 kHz operating point for variable phase shift circuit 22 at the lowest point of phase angle curve $\phi_I$, where R equals 1 megohm. If the damping or energy loss in crystal 10 should change, reflecting a change in the equivalent circuit value R, the gain of transimpedance amplifier 14 will change slightly causing a concomitant change in the level of the sine wave signal output on conductor 30. The change in the rectified DC level input over conductor 40 to variable gain amplifier 18 compensates for the change in R to maintain a unity gain through feedback loop conductor 26. At the same time, the variation in signal levels applied via conductor 36 to the absolute value circuit causes it to shift from the nominal operating point, producing a phase shift in 22 which then produces an output signal that tracks along the approximated phase angle curve $\phi_A$ on either the left or the right side of the nominal operating point, depending upon whether the equivalent circuit resistance of crystal 10, R, has either increased or decreased. The signal input to variable phase shift circuit 22 over conductor 42 from the absolute value circuit thus compensates for a shift in phase angle resulting from the change in R so that the operating frequency remains constant.

The block diagram of FIG. 4 also includes an optional voltage amplifier 50 connected to the output of precision rectifier 34 via conductor 52, and to the output of voltage reference 44 via conductor 48. Voltage amplifier 50 provides a DC output voltage over conductor 50 indicative of the deviation from the nominal operating point of the equivalent circuit resistance R of crystal 10, enabling that parameter to be readily monitored. The damping voltage output signal may, for example, be recorded on a strip chart recorder. However, it will be apparent that voltage amplifier 50 may be eliminated from the damping decoupled oscillator without in any way affecting its intended function and operation.

Figure 5:
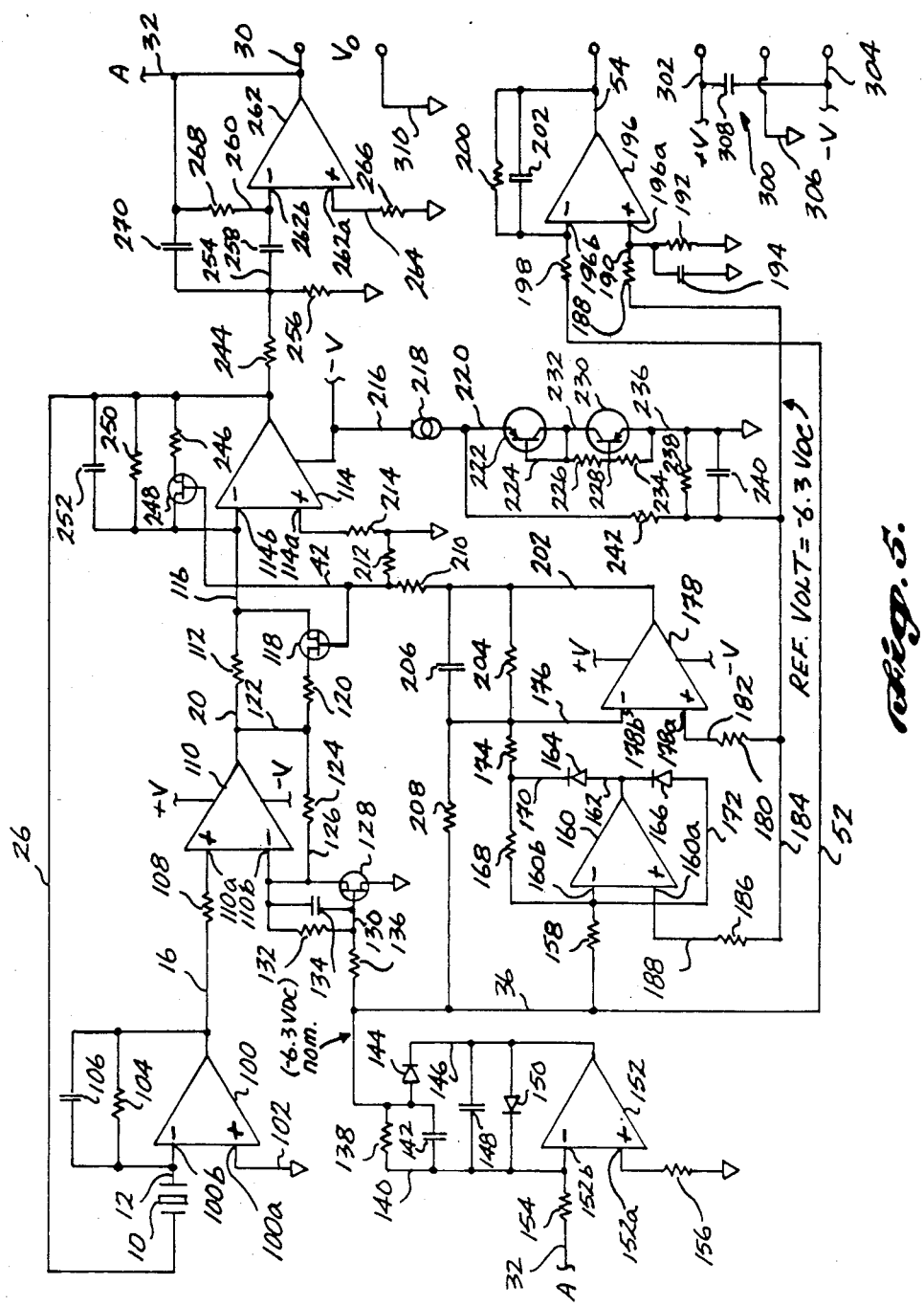
FIG. 5 is a schematic diagram of the damping decoupled oscillator.

Turning now to FIG. 5, a schematic diagram illustrates details of the components comprising the damping decoupled crystal oscillator according to a preferred embodiment. The periodic signal produced by crystal 10 is connected through conductor 12 to the inverting input 100b of an operational amplifier (op amp) 100. The noninverting input 100a is connected to ground through conductor 102. At the operating frequency, op amp 100 has a gain equal to the resistance of resistor 104 divided by the equivalent circuit resistance, R, of crystal 10. Resistor 104 is connected in parallel in the feedback loop of op amp 100 with capacitor 106, providing a filtering function which tends to track the change in damping decoupling phase angle as a function of change in frequency output from crystal 10, as will be explained below. The output from op amp 100 is a periodically varying voltage corresponding to the periodically varying input current from crystal 10, but is inverted with respect thereto.

Conductor 16 conveys the output signal from op amp 100 to an input resistor 108, which is connected to the noninverting input 110a of op amp 110. The inverting input 110b of the op amp is connected to a variable gain signal supplied from a resistor 132, in parallel with a capacitor 134 and a field effect transistor (FET) 128. The output from op amp 110 appears on conductor 20 and is conveyed via conductor 122 to a feedback resistor 126, which is connected through conductor 124 to one side of FET 128. A gate resistor 136 limits current flow to the gate of FET 128 from a gain control signal source, described below. The voltage of the gain control signal at the nominal operating point is −6.3 volts DC in the preferred embodiment. Variation of the voltage about this operating point changes the extent to which FET 128 pinches off current flow between its source and drain, and therefore effects the amount of gain provided by op amp 110 within the range from 0 to 12 DB maximum. FET 128, op amp 110, and their associated resistors 108, 124, 132, and 136 and capacitor 134 together comprise the voltage controlled amplifier 18 shown in FIG. 4.

The gain controlled periodic signal output from op amp 110 is conveyed through conductor 20 to resistor 112, and thereafter through conductor 116 to inverting input 114b of op amp 114. A parallel path comprising resistor 120 and FET 118 is also connected to the inverting input of op amp 114. The feedback loop for op amp 114 comprises a capacitor 252 connected in parallel with a resistor 250, and with series connector resistor 246 and FET 248. FET 248 thus provides a variable feedback resistance (in combination with resistors 246 and 250), which with capacitor 252 is effective to vary the phase angle of a periodic signal propagating through op amp 114. The value of resistor 120 equals the value of resistor 246, and the value of resistor 112 equals that of resistor 250. Furthermore, the gates of FET 118 and FET 248 are provided with the same phase angle control voltage through conductor 242, so that as the feedback resistance of FET 248 changes in response to the phase angle control voltage, the input impedance of FET 118 changes in an equivalent fashion. As a result, a variation in the resistance of FETS 118 and 248 has a minimal effect on the gain of op amp 114. However, variation in the resistance of FET 248 is able to change the phase angle of the signal propagating through op amp 114 in the range from −30° through −15° due to parallel capacitor 252. The phase angle control voltage is applied to conductor 42 through a resistor 210. Conductor 42 is also connected through a resistor 212 to ground and through resistor 214 to the noninverting input 114a of op amp 114. The associated resistors, FETS 118 and 248, capacitor 252, and op amp 114 thus comprise the variable phase shift circuit 22 shown in FIG. 4.

In the preferred embodiment, crystal 10 is used in a force sensing application in which the applied force causes a change in its frequency from a nominal 35 kHz. As the frequency output from crystal 10 changes due to the force applied to it, the damping decoupling phase angle changes as shown in FIG. 3. The variation in phase angle caused by changes in the resistance of FET 248 compensate for changes in the value of the damping represented by the resistance, R; however, changes to the damping decoupling phase response in respect to variations in frequency of the periodic signal output from crystal 10 must also be accommodated according to the relationship of FIG. 3. The values of capacitor 106 and resistor 104 in the feedback loop of op amp 100, and the values of resistor 250 and capacitor 252 in the feedback loop of op amp 114 are selected so that as the frequency output from crystal 10 changes due to the force applied to it, the damping compensation tracks those changes according to the relationship shown in FIG. 3.

The output from op amp 114 is conveyed through feedback loop conductor 26 back to crystal 10 to sustain its oscillation. The unity gain of the series connected circuit comprising crystal 10, transimpedance amplifier 14, variable gain amplifier 18 and variable phase shift circuit 22 in FIG. 4 is maintained by variable gain amplifier 18. Therefore, a generally constant level is output from op amp 114 through resistor 244. Resistor 244 is connected to a capacitor 258 via conductor 254. The other side of capacitor 258 is connected to the inverting input 262b of an op amp 262. The noninverting input 262a of the op amp is connected through conductor 264 and resistor 266 to ground. A capacitor 270 is connected in parallel with a resistor 268 on each side of capacitor 258. The junction of capacitors 270 and 258 is connected to ground through a resistor 256. Since the resistance of feedback resistor 268 is substantially greater than the effective resistance of the combined resistors 244 and 256, op amp 262 provides an amplification function. The values of these resistors and of capacitors 258 and 270 are selected to provide the 35 kHz center frequency for the band pass filter, substantially limiting both low frequency and high frequency noise outside a ±10 kHz pass band.

The output of op amp 262, which appears on conductor 30, comprises the damping decoupled output of the crystal controlled oscillator. This output signal is conveyed via conductor 32 (connecting points "A" in FIG. 5) to an input resistor 154, and through that resistor to the inverting input 152b of an op amp 152. The noninverting input 152a of the op amp is connected through resistor 156 to ground. A feedback loop for the op amp comprises a diode 150 having its anode connected to the output of the op amp in parallel with a capacitor 148. In addition, these two elements are connected in parallel with a parallel-connected capacitor 142 and resistor 138 that are connected in series with a diode 144 having its cathode connected to the output of op amp 152. Diodes 144 and 150 provide a full wave rectifying function, while capacitors 142 and 148 in combination with resistor 138 operate to filter the full wave rectified signal providing a DC level from the common junction of resistor 138, capacitor 142 and the anode of diode 144. The filtered DC level output from this node has an amplitude that depends upon the level of the output signal from op amp 262, (−6.3 volts DC at the nominal operating point). As previously described above, the filtered and rectified DC signal comprises the gain control signal used to control the amount of gain provided by op amp 110. In addition, the filtered DC signal is connected through conductor 36 and a resistor 158 to the inverting input 160b of op amp 160. The output of op amp 160 is connected to the anode of diode 164 and the cathode of diode 166. The cathode of diode 164 is connected in series with a feedback resistor 168, providing a feedback loop to the inverting input 160b of the op amp. Likewise, the anode of diode 166 is connected through the conductor 172 to the inverting input. The noninverting input 160a of op amp 160 is connected through conductor 188 to a resistor 186 and thus to conductor 184, which is maintained at a reference voltage equal to −6.3 volts DC. The reference voltage corresponds to the nominal operating point as described above.

The junction of diode 164 and resistor 168 is connected through resistor 174 to the inverting input 178b of op amp 178. The noninverting input 178a is connected through conductor 182 to resistor 180, and consequently to the reference voltage line, conductor 184. A feedback resistor 204 is connected to the output of op amp 178 amp via conductor 202, and the other end of the feedback resistor is connected to conductor 176. In parallel with resistor 204 is a capacitor 206, which provides a filtering function for the absolute value circuit 38. The other end of capacitor 206 is connected to the conductor 176 and to a resistor 208; the other end of this resistor is connected to conductor 36.

Op amps 160 and 178 in combination with diodes 164 and 166, and the resistors associated with the op amps comprise an absolute value circuit approximating the phase angle curve $\phi_I$ of FIG. 2. As noted above, the absolute value circuit 38 produces an output on conductor 202 having a positive and negative slope (curve $\phi_A$), which intersect at the nominal operating point for the damping decoupling circuit. That point corresponds to a voltage on conductor 36 equal to −6.3 volts DC. Whenever the damping or energy loss, R, of crystal 10 changes from the nominal operating point, the output signal on conductor 30 changes amplitude, causing the rectified DC level on conductor 36 to change. This voltage is input to op amp 160 and compared to the reference voltage, −6.3 volts DC. The differential voltage between the DC level and the reference voltage is rectified by diodes 164 and 166 (providing the absolute value) and amplified by op amp 178. The absolute value of any deviation from the nominal operating point is required because FET 248 and the variable phase shift circuit 22 must be "pinched off" if the value of R either decreases or increases.

The reference voltage used to establish the operating point for the absolute value circuit is derived from a −15 volt DC negative voltage supply through a conductor 216, which is connected to a current source 218. This current is conveyed via a conductor 220 both to the emitter of a transistor 222 and to one side of a resistor 242. The other side of resistor 242 is connected to the conductor 184 on which the reference voltage appears. The collector of transistor 222 is connected back to its base through a conductor 224 and to the collector of a transistor 230 through a conductor 232. In addition, the collector of both transistors 222 and 232 is connected through resistor 226 to the base of transistor 230 through a conductor 228. The base of transistor 230 is connected to its emitter through resistor 234, and the emitter is connected to ground and to one side of a resistor 238 and a parallel connected capacitor 240. Resistors 234 and 238 divide down the regulated voltage in conductor 222 to −6.3 volts DC. Transistors 222 and 230 provide temperature compensation to regulate the voltage on conductor 184 to the desired −6.3 volts DC level, irrespective of modest temperature changes in the environment to which the circuit is exposed.

Resistors 238 and capacitor 240 filter out noise on the reference voltage line.

The optional voltage amplifier 50 shown in FIG. 4 comprises an op amp 196 having an inverting input 196b connected through a resistor 198 to the rectified signal level on conductor 36. The noninverting input 196a is connected through conductor 190 to a resistor 188 and thus to the reference voltage line, conductor 184. In addition, conductor 190 and the noninverting input of the op amp are referenced to ground through parallel connected resistor 192 and capacitor 194. The output from op amp 196 feeds back to the noninverting input 196b through parallel connected resistor 200 and capacitor 202, providing a filtering of the output signal. Further, since the value of feedback resistor 200 is approximately three times the value of the input resistor 198, op amp 196 provides a gain factor of three. The output of the op amp appears on conductor 54 for connection to a monitoring and/or recording device as required.

Op amps 100, 110, 114 and 262 comprise a single quad op amp chip while op amps 152, 160, 178 and 196 comprise a second quad op amp chip. Voltage is supplied to each of these quad op amps from a generally conventional power source (not shown) capable of providing plus and minus 15 volts DC, designated by +V and −V, respectively. The positive voltage is supplied via conductor 302, while the negative voltage is supplied over conductor 304. Ground reference is provided via a conductor 306. Connected between conductors 302 and 304 is filtering capacitor 308. The +V and −V voltages are supplied to each of the two quad op amps as shown in FIG. 5, with respect to op amp 110 and op amp 178. The output signal on conductor 30 is likewise referenced to ground via conductor 310.

Although the preferred embodiment is used with a force sensing crystal, it may also be applied to crystals used in other oscillators in which changes in damping may occur. The preferred embodiment uses a precision rectifier to determine the DC amplitude of the output signal of the oscillator, but other amplitude determinant circuitry could be used, e.g., a peak detecting circuit, or a sample and hold circuit, to provide an equivalent function. In addition, an alternative circuit could be used instead of the absolute value circuit 38 to provide a compensating signal for shifting the phase angle. A differently shaped function may be used for phase response compensation, depending upon the selection of the nominal operating point.

While the damping decoupled crystal oscillator has been disclosed with respect to a preferred embodiment and various modifications thereto, those of ordinary skill in the art will appreciate that further modifications within the scope of the claims that follow hereafter may be made to the invention. Accordingly, it is not intended that the invention should in any way be limited by what is disclosed as the preferred embodiment, but instead, the scope of the invention should be determined entirely by reference to the claims that follow.

The embodiments of the invention in which an exclusive property or privilege is claimed are defined as follows:

1. A damping decoupled crystal oscillator comprising:
    (a) a piezoelectric crystal driven to oscillate close to its resonant frequency, producing a periodic signal, the piezoelectric crystal being connected to a feedback loop providing a feedback signal derived from the periodic signal, to sustain oscillation of the piezoelectric crystal;
(b) a variable gain amplifier connected to amplify the periodic signal produced by the piezoelectric crystal at a gain dependent upon a gain control signal;
(c) variable phase shift means, connected in series relationship with the variable gain amplifier, for introducing a phase shift in the signal produced by the piezoelectric crystal in response to a phase control signal, the series connected variable gain amplifier and phase shift means producing an output signal comprising the feedback signal;
(d) level detecting means connected to receive the output signal and operative to determine the amplitude of the output signal to produce the gain control signal;
(e) damping change compensation means, connected to receive the gain control signal, for producing the phase control signal as a function of the gain control signal, the frequency of said output signal being thus compensated for and decoupled from changes in damping to which the piezoelectric crystal may be subjected.

2. The damping decoupled crystal oscillator of claim 1, further comprising a transimpedance amplifier connected between the piezoelectric crystal and the variable gain amplifier, the transimpedance amplifier functioning to amplify the voltage of the periodic signal.

3. The damping decoupled oscillator of claim 1, further comprising a reference voltage connected to the damping change compensating means, the reference voltage serving to establish an offset in the phase control signal.

4. The damping decoupled oscillator of claim 1, wherein the damping change compensation means comprise an absolute value circuit that produces a phase control signal corresponding to the absolute value of the gain control signal.

5. The damping decoupled oscillator of claim 1, further comprising a band-pass filter connected to receive the output signal from the series connected variable gain amplifier and phase shift means, producing a filtered output signal that is input to the rectifier, said band-pass filter having a pass band centered about the resonant frequency of the piezoelectric crystal.

6. The damping decoupled oscillator of claim 1, wherein the level detecting means comprise a rectifier.

7. A method for compensating for changes in damping of a crystal oscillator comprising the steps of
(a) determining the amplitude of an output signal derived from a periodic signal produced by the oscillator to provide a gain control signal;
(b) amplifying the periodic signal of the oscillator with a gain that is a function of the gain control signal; and
(c) varying the phase of the periodic signal as a function of the gain control signal to decouple and compensate for changes in damping to which the crystal may be subjected.

8. The method of claim 7, wherein the periodic signal is connected to a feedback loop of the crystal oscillator, following the steps of amplifying it and varying its phase.

9. The method of claim 8, further comprising the step of filtering the periodic signal connected to the feedback loop with a band-pass filter, producing the output signal, the center frequency of the band-pass filter being substantially equal to a resonant frequency of the crystal oscillator.

10. The method of claim 7, wherein the step of varying the phase comprises the step of producing a phase control signal.

11. The method of claim 9, wherein the phase control signal corresponds to the absolute value of the gain control signal.

12. The method of claim 7, wherein the step of determining the amplitude of the output signal comprises the step of rectifying said output signal.

13. Apparatus for compensating a periodic signal output from a crystal oscillator for changes in damping, comprising:
(a) a variable gain amplifier having a voltage controlled gain, the variable gain amplifier being connected to amplify the periodic signal output from the oscillator;
(b) a variable phase shifting means, connected in series with the variable gain amplifier, for shifting the phase of the periodic signal in response to a phase control signal, the variable phase shifting means and the variable gain amplifier together producing an output signal;
(c) a rectifier connected to rectify the output signal and to produce a DC voltage corresponding thereto; the DC voltage being input to the variable gain amplifier to control its gain; and
(d) damping compensation means for producing the phase control signal as a function of the DC voltage produced by the rectifier, the phase control signal causing the variable phase shifting means to vary the phase of the periodic signal to compensate for changes in the oscillator damping.

14. The apparatus of claim 13, wherein the phase control signal is a nonlinear function of the DC voltage produced by the rectifier.

15. The apparatus of claim 13, further comprising a voltage reference connected to supply a predefined offset voltage to the damping compensation means.

16. The apparatus of claim 13, wherein the damping compensation means comprise an absolute value circuit that generates a phase control signal corresponding to the absolute value of the DC voltage produced by the rectifier.

17. The apparatus of claim 13 further comprising a current-to-voltage amplifier disposed between the crystal oscillator and the variable gain amplifier.

18. The apparatus of claim 13 further comprising a band-pass filter that is operative to filter the output signal, passing a band of frequencies centered about a resonant frequency of the crystal oscillator, a filtered signal output from the band-pass filter comprising the output signal rectified by the rectifier.

* * * * *